United States Patent
Poh et al.

(12)

(10) Patent No.: US 9,165,610 B1
(45) Date of Patent: Oct. 20, 2015

(54) NON-VOLATILE MEMORY CELL ARRAYS AND METHODS OF FABRICATING SEMICONDUCTOR DEVICES

(71) Applicant: GLOBALFOUNDRIES Singapore Pte. Ltd., Singapore (SG)

(72) Inventors: Francis Poh, Singapore (SG); Shifeng Zhao, Singapore (SG); Yang Hong, Ottobrunn (DE); Tze Ho Simon Chan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/318,766

(22) Filed: Jun. 30, 2014

(51) Int. Cl.
*G11C 11/02* (2006.01)
*G11C 13/00* (2006.01)
*G11C 5/06* (2006.01)
*G11C 11/40* (2006.01)
*G11C 8/00* (2006.01)
*G11C 5/02* (2006.01)
*G11C 8/14* (2006.01)
*H01L 27/24* (2006.01)
*G11C 7/18* (2006.01)

(52) U.S. Cl.
CPC .............. *G11C 5/06* (2013.01); *G11C 13/0002* (2013.01); *H01L 27/2436* (2013.01); *G11C 5/025* (2013.01); *G11C 7/18* (2013.01); *G11C 8/14* (2013.01); *G11C 13/003* (2013.01); *G11C 2213/74* (2013.01)

(58) Field of Classification Search
CPC .... G11C 5/06; G11C 13/003; G11C 13/0002; G11C 2213/74; G11C 2213/79; G11C 7/18; G11C 5/025; G11C 8/14
USPC ........................ 365/148, 158, 163, 51, 72, 46
See application file for complete search history.

(56) References Cited

U.S. PATENT DOCUMENTS

| | | | |
|---|---|---|---|
| 6,606,263 B1 * | 8/2003 | Tang | 365/158 |
| 2001/0033508 A1 * | 10/2001 | Waller | 365/49 |
| 2004/0160809 A1 * | 8/2004 | Lin et al. | 365/158 |
| 2004/0257868 A1 * | 12/2004 | Tang et al. | 365/173 |
| 2010/0072530 A1 * | 3/2010 | Takizawa et al. | 257/295 |
| 2010/0091555 A1 * | 4/2010 | Fukami | 365/158 |
| 2011/0069534 A1 * | 3/2011 | Inaba | 365/158 |
| 2011/0211390 A1 * | 9/2011 | Hanzawa et al. | 365/163 |
| 2011/0228595 A1 * | 9/2011 | Rao et al. | 365/158 |

* cited by examiner

*Primary Examiner* — Ly D Pham
(74) *Attorney, Agent, or Firm* — Ingrassia Fisher & Lorenz, P.C.

(57) ABSTRACT

Disclosed herein are memory cell arrays, semiconductor devices, and methods for fabricating semiconductor devices. In one embodiment, a memory cell array includes first, second, third, and fourth memory cells each having a first transistor and a second transistor. First and second word-lines are coupled with the gates of the first transistors of the first and second memory cells. The second and a third word-line are coupled with the gates of the second transistors of the third and fourth memory cells.

20 Claims, 3 Drawing Sheets

US 9,165,610 B1

NON-VOLATILE MEMORY CELL ARRAYS AND METHODS OF FABRICATING SEMICONDUCTOR DEVICES

TECHNICAL FIELD

The present disclosure generally relates to non-volatile memory cell arrays and methods of fabricating semiconductor devices, and more particularly relates to non-volatile memory cell arrays with offset memory cell lines that share word lines.

BACKGROUND

Non-volatile memory or non-volatile storage is computer memory that is capable of storing digital data when not powered. Non-volatile memory includes read-only memory, flash memory, ferroelectric RAM (F-RAM), some types of magnetic computer storage devices (e.g. hard disks, floppy disks, and magnetic tape), and optical discs, among others. One typical type of non-volatile memory utilizes one transistor and one resister (1T1R) per memory cell. These 1T1R designs typically have an increased transistor width to accommodate the drive current required to operate the memory cell. Such increased widths restrict the number of memory cells that may be fabricated on one semiconductor wafer.

Another type of non-volatile memory cell utilizes two transistors and one resistor (2T1R) per memory cell. In a typical 2T1R memory cell array, each pair of word lines operates on the same row of memory cells. These rows of memory cells are aligned in a grid pattern so that adjacent rows of memory cells have storage elements that are aligned in a longitudinal direction of the rows of memory cells. Such alignment has been shown to result in substantial electrical interference such as crosstalk and disturb phenomena, as will be appreciated by those with skill in the art. In order to reduce such interference, a distance between storage elements is typically increased, resulting in fewer memory cells per semiconductor wafer. Although these typical 2T1R memory cells and arrays are suitable for their intended purpose, the need for reduced size and increased performance is essentially constant.

Accordingly, it is desirable to provide a memory cell array that has a reduced size and interference relative to existing memory cell arrays. Furthermore, other desirable features and characteristics of the memory cell arrays and methods of storing data will become apparent from the subsequent detailed description and the appended claims, taken in conjunction with the accompanying drawings, brief summary, and this background.

BRIEF SUMMARY

Memory cell arrays, semiconductor devices, and methods of fabricating semiconductor devices are disclosed herein. In an exemplary embodiment, a memory cell array includes first, second, third, and fourth memory cells each having a first transistor and a second transistor. Each of the first transistors and second transistors have a source, a drain, and a gate. A first word-line is coupled with the gates of the first transistors of the first and second memory cells. A second word-line is coupled with the gates of the second transistors of the first and second memory cells and the gates of the first transistors of the third and fourth memory cells. A third word-line is coupled with the gates of the second transistors of the third and fourth memory cells.

In accordance with another exemplary embodiment, a semiconductor device includes first, second, third, and fourth memory cells each having a first transistor and a second transistor. Each of the first transistors and second transistors have a source, a drain, and a gate. A first word-line is coupled with the gates of the first transistors of the first and second memory cells. A second word-line is coupled with the gates of the second transistors of the first and second memory cells and the gates of the first transistors of the third and fourth memory cells. A third word-line is coupled with the gates of the second transistors of the third and fourth memory cells.

In accordance with another exemplary embodiment, a method of fabricating a semiconductor device includes providing a semiconductor substrate and doping source and drain regions of first and second transistors for each of a first memory cell, a second memory cell, a third memory cell, and a fourth memory cell. The method further includes forming gates for each of the first and second transistors of each of the first, second, third, and fourth memory cells. The method further still includes coupling a first word-line to the gates of the first transistors of the first and second memory cells and coupling a second word-line to the gate of the second transistor of the first memory cell, the gate of the second transistor of the second memory cell, the gate of the first transistor of the third memory cell, and the gate of the first transistor of the fourth memory cell. The method further still includes coupling a third word-line to the gate of the second transistor of the third memory cell and the gate of the second transistor of the fourth memory cell and coupling a first bit-line to the drains of the first and second transistors of the first memory cell and the drains of the first and second transistors of the third memory cell. The method further still includes coupling a second bit-line to the drains of the first and second transistors of the second memory cell and the drains of the first and second transistors of the fourth memory cell. The method further still includes coupling a first source-line to the sources of the first and second transistors of the first memory cell, coupling a second source-line to the sources of the first and second transistors of the second memory cell, coupling a third source-line to the sources of the first and second transistors of the third memory cell, and coupling a fourth source-line to the sources of the first and second transistors of the fourth memory cell.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Exemplary embodiments of the present disclosure will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Embodiments of the present disclosure provide memory cell arrays, semiconductor devices, and methods of fabricating semiconductor devices. As will be appreciated from the description below, the arrays and devices utilize shared word-lines between adjacent memory cell lines, staggered or offset storage elements, unique write and read settings, and shared connection of lines of memory cells to upper metal layers of the arrays and semiconductor devices.

Figure 1:
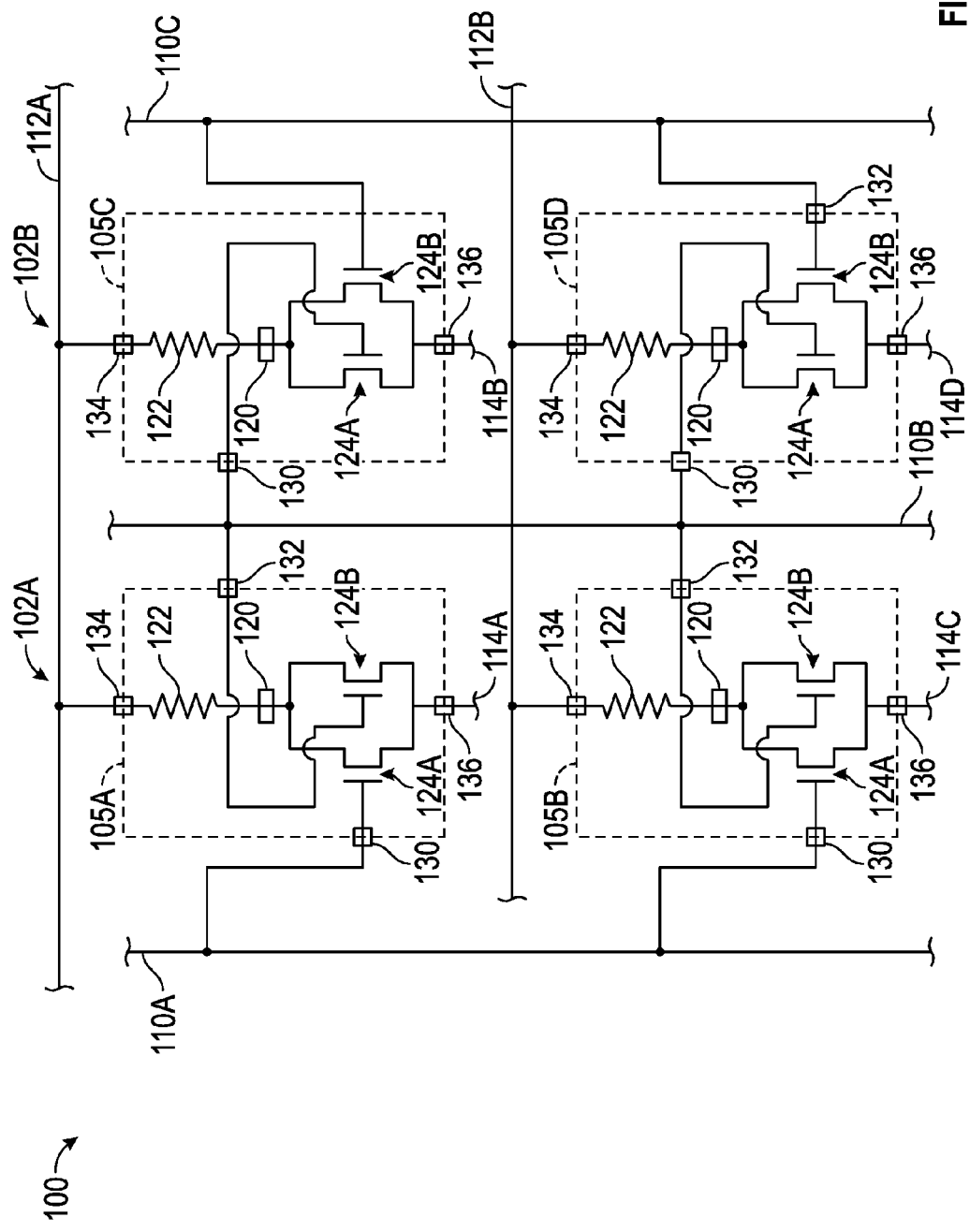
FIG. 1 is an electrical schematic of a non-volatile memory cell array in accordance with some embodiments.

FIG. 1 illustrates an electrical schematic of a non-volatile memory cell array 100 according to some embodiments. Memory cell array 100 includes a first row 102A of memory cells, a second row 102B of memory cells, a first word-line 110A, a second word-line 110B, a third word-line 110C, a first bit-line 112A, a second bit-line 112B, a first source-line 114A, a second source-line 114B, a third source-line 114C, and a fourth source-line 114D. Word-lines 110A-C, bit-lines 112A-B, and source-lines 114A-C are paths of electrically conductive material that selectively operate memory cells 105A-D, as will be described below. It should be appreciated that many more than four memory cells may be included in memory cell array 100.

First row 102A of memory cells includes a first set of memory cells with a first memory cell 105A and a second memory cell 105B. Second row 102B of memory cells includes a second set of memory cells with a third memory cell 105C and a fourth memory cell 105D. Memory cells 105A-D are two transistor one resistor (2T1R) cells that each include a storage element 120, a resistor 122, a first transistor 124A, and a second transistor 124B. Memory cells 105A-D are electrically coupled with one of word-lines 110A-C at a first word-line interface 130, another of word-lines 110A-C at a second word-line interface 132, one of bit-lines 112A-B at a bit-line interface 134, and one of source-lines 114A-D at a source-line interface 136. Interfaces 130, 132, 134, and 136 are defined by electrically conductive material at boundaries of memory cells 105A-D.

Storage element 120 may be any non-volatile storage element. For example, storage element 120 may be a spin-transfer-torque magnetoresistive random-access-memory (STT-MRAM), a resistive random-access memory (ReRAM), phase change random-access-memory (PCRAM), or the like. In another example, the resistance change in a spin-transfer-torque random-access-memory device (STTRAM) is the result of different orientation alignment (parallel or anti-parallel) of the magnetization direction of top and bottom ferromagnetic electrodes. The change from parallel to anti-parallel requires higher switching current/power than that from anti-parallel to parallel. As can be appreciated, various other non-volatile memory devices (e.g., resistive random-access memory devices (RRAM)) similarly display asymmetric switching characteristics.

In some embodiments, storage element 120 is any non-volatile storage element that is added to a semiconductor device during a back end-of-line (BEOL) semiconductor fabrication process after completion of front end-of-line semiconductor fabrication processing. During an FEOL semiconductor fabrication process, a plurality of semiconductor devices (e.g., transistors, resistors, and the like) is generally formed on a semiconductor substrate. During a BEOL semiconductor fabrication process, the semiconductor devices are connected by a network of electrically-conductive lines, vias, and interconnect structures. The network of electrically-conductive lines, vias, and interconnect structures selectively connect the semiconductor devices to each other and to various other devices such as, but not limited to, a power source, clocks, signals, addresses, and input and output sources, and also connect the semiconductor devices to subsequently-formed semiconductor devices. In this manner, a plurality of integrated circuits (ICs) is formed on the semiconductor substrate with electrical connection enabled through the network of electrically-conductive lines, vias, and interconnect structures.

Transistors 124A-B are disposed in parallel between source-line interface 136 and storage element 120. First transistor 124A includes a source electrically coupled with source-line interface 136, a drain electrically coupled with storage element 120, and a gate electrically coupled with first word-line interface 130. Second transistor 124B includes a source electrically coupled with source-line interface 136, a drain electrically coupled with storage element 120, and a gate electrically coupled with second word-line interface 132. In the example provided, transistors 124A and 124B are N-type metal-oxide-semiconductor (NMOS) transistors and are fabricated during an FEOL semiconductor fabrication process. In the example provided, resistor 122 is electrically coupled between storage element 120 and bit-line interface 134.

Figure 2:
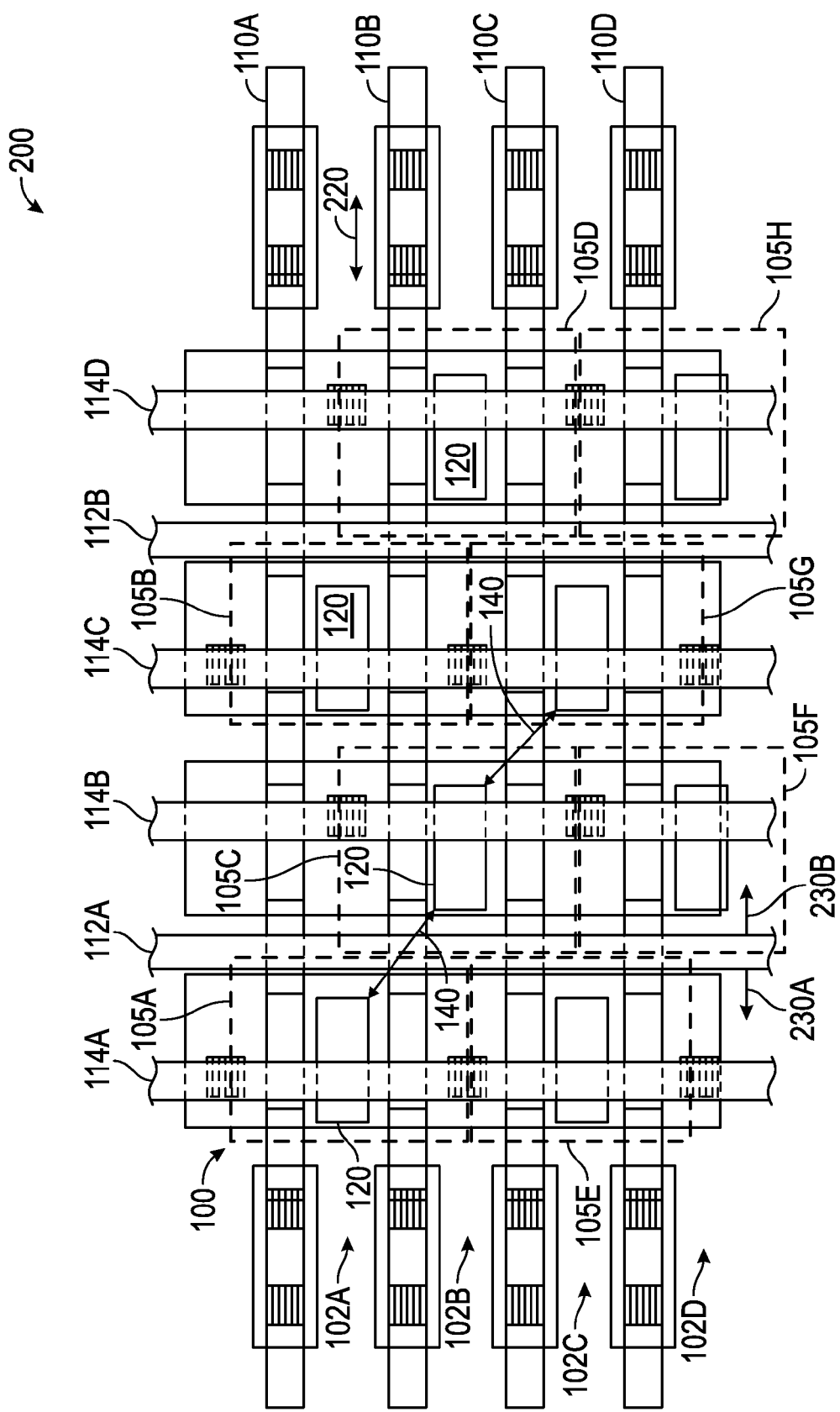
FIG. 2 is a top view of a semiconductor device that includes the memory cell array of FIG. 1 in accordance with some embodiments.

FIG. 2 illustrates a top view of a semiconductor device 200 that includes memory cell array 100 according to some embodiments. The components of semiconductor device 200 are formed in different layers and selectively coupled by vias, interconnects, or other electrically conductive structures, as will be appreciated by those with skill in the art. For example, source and drain regions of transistors 124A-B may be formed by doping a single crystal silicon substrate. Word-lines 110A-C, bit-lines 112A-B, source-lines 114A-D, and memory cells 105A-D may then be formed using well known techniques and process steps (e.g., photolithography, doping, etching, patterning, material growth, material deposition, and the like) that will not be described in detail here. In some embodiments, the semiconductor material used is silicon. In some alternative embodiments, the semiconductor material may include germanium, gallium arsenide, or the like.

Semiconductor device 200 further illustrates third and fourth rows 102C, 102D of memory cells and a fourth word-line 110D. Rows 102C-D of memory cells include additional memory cells 105E, 105F, 105G, 105H. Rows 102C-D of memory cells are similar to rows 102A-B of memory cells, and are presented to illustrate how semiconductor device 200 scales memory cell array 100.

Storage element 120 of each memory cell line is offset from storage element 120 of the adjacent memory cell line. For example, storage elements 120 of first row 102A of memory cells are offset from storage elements 120 of second row 102B of memory cells along a longitudinal direction 220 of first row 102A of memory cells. As used herein, being offset along longitudinal direction 220 means that any plane drawn normal to a longitudinal direction of a word-line will pass through at most one storage element of any two consecutive adjacent word-lines within a continuous memory array. Accordingly, cross-talk between word-lines is determined by a diagonal distance 140 between corners of storage elements 120, rather than by a distance between opposing flat edges as in traditional 2T1R designs. Such a diagonal separation has been shown to reduce cross-talk and improve memory cell performance.

In the example provided, bit-lines 112A-B are electrically coupled to each lateral side with storage elements 120. For example, first bit-line 112A is coupled with first memory cell 105A and third memory cell 105C. First memory cell 105A is disposed to a first lateral side 230A of first bit-line 112A and third memory cell 105C is disposed to a second lateral side 230B of first bit-line 112A.

During operation of memory cell array 100 and semiconductor device 200, word-lines 110A-D, bit-lines 112A-B, and source-lines 114A-D are selectively energized or grounded to read from, write to, or erase a selected memory cell 105A-H. For example, first memory cell 105A may be selected by energizing first word-line 110A, second word-line 110B, and first bit-line 112A while grounding first source-line 114A. Second source-line 114B is also energized to restrict first transistor 124A of second memory cell 105B from allowing current to flow due to the energized second word-line 110B and first bit-line 112A, as will be appreciated by those with skill in the art.

Figure 3:
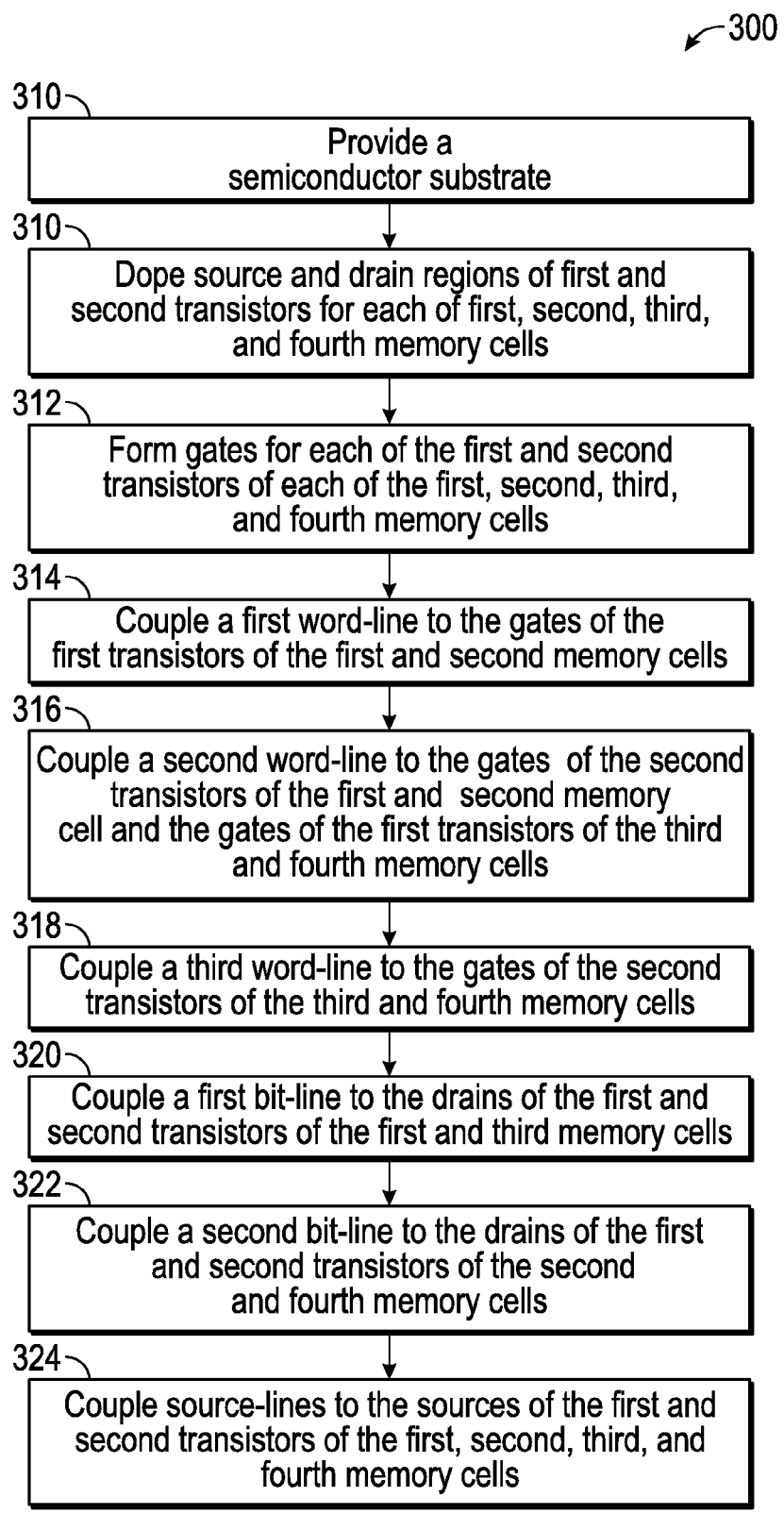
FIG. 3 is a flow diagram illustrating a method of fabricating the semiconductor device of FIG. 2 in accordance with some embodiments.

FIG. 3 is a flow diagram illustrating a method 300 of fabricating a semiconductor device. For example, operations of method 300 may be performed to fabricate semiconductor device 200. Operation 310 provides a semiconductor substrate and operation 310 dopes source and drain regions of first and second transistors for each of first, second, third, and fourth memory cells. For example, operations 310 and 312 may dope the source and drain regions of first and second transistors 124A-B of memory cells 105A-D.

Operation 312 forms gates for each of the first and second transistors of each of the first, second, third, and fourth memory cells. Operation 314 couples a first word-line to the gates of the first transistors of the first and second memory cells. For example, operation 314 may couple first word-line 110A with first and second transistors 124A-B of first and second memory cells 105A-B.

Operation 316 couples a second word-line to the gate of the second transistor of the first memory cell, the gate of the second transistor of the second memory cell, the gate of the first transistor of the third memory cell, and the gate of the first transistor of the fourth memory cell. For example, operation 316 may couple second word-line 110B with the gates of second transistors 124B of first and second memory cells 105A-B and the gates of first transistors 124A of third and fourth memory cells 105C-D. Operation 318 couples a third word-line to the gate of the second transistor of the third memory cell and the gate of the second transistor of the fourth memory cell. For example, operation 318 may couple third word-line 110C to the gates of second transistors 124B of the third and fourth memory cells 105C-D.

Operation 320 couples a first bit-line to the drains of the first and second transistors of the first memory cell and the drains of the first and second transistors of the third memory cell. For example, operation 320 may couple first bit-line 112A to drains of first and second transistors 124A-B of first and third memory cells 105A and 105C through storage elements 120 and resistors 122 of memory cells 105A and 105C.

Operation 322 couples a second bit-line to the drains of the first and second transistors of the second memory cell and the drains of the first and second transistors of the fourth memory cell. For example, operation 322 may couple second bit-line 112B to drains of first and second transistors 124A-B of second and fourth memory cells 105B and 105D through storage elements 120 and resistors 122 of memory cells 105B and 105D. In the example provided, coupling is achieved by depositing the first bit-line perpendicular to the first word-line so that the first bit-line is disposed on a plane that passes between the first memory cell and the third memory cell.

Operation 324 couples a first source-line to the sources of the first and second transistors of the first memory cell, a second source-line to the sources of the first and second transistors of the second memory cell, a third source-line to the sources of the first and second transistors of the third memory cell, and a fourth source-line to the sources of the first and second transistors of the fourth memory cell. For example, operation 324 may couple first source-line 114A to source interface 136 of first memory cell 105A, second source-line 114B to source interface 136 of second memory cell 105B, third source-line 114C to source interface 136 of third memory cell 105C, and fourth source-line 114D to source interface 136 of fourth memory cell 105D.

Operation 326 forms non-volatile storage elements in a back end-of-line semiconductor fabrication process for each of the first, second, third, and fourth memory cells. For example, operation 326 may form storage elements 120 of memory cells 105A-D. Operation 328 aligns the first memory cell and the third memory cell in a first row of memory cells and the second memory cell and the fourth memory cells in a second row of memory cells. Operation 328 further offsets the first row of memory cells from the second row of memory cells along a longitudinal direction of the first row of memory cells. For example, first and second memory cells 105A-B may be aligned into first row 102A of memory cells and third and fourth memory cells 105C-D may be aligned into second row 102B of memory cells. As described above, first row 102A and second row 102B are substantially parallel to each other and to first word-line 110A.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A memory array, comprising:
   first, second, third, and fourth memory cells each having a first transistor and a second transistor, each of the first transistors and second transistors having a source, a drain, and a gate;
   a first word-line electrically coupled with the gate of the first transistor of the first memory cell and the gate of the first transistor of the second memory cell;
   a second word-line electrically coupled with the gate of the second transistor of the first memory cell, the gate of the second transistor of the second memory cell, the gate of the first transistor of the third memory cell, and the gate of the first transistor of the fourth memory cell; and
   a third word-line electrically coupled with the gate of the second transistor of the third memory cell and the gate of the second transistor of the fourth memory cell.

2. The memory array of claim 1, wherein the first memory cell and the third memory cell are aligned to form a first row of memory cells and the second memory cell and the fourth memory cells are aligned to form a second row of memory cells, and wherein the first row of memory cells is offset from the second row of memory cells along a longitudinal direction of the first row of memory cells.

3. The memory array of claim 2, wherein the first word-line and the second word-line cooperate to read from, erase from, or write to the first row of memory cells, and the second word-line and the third word-line cooperate to read from, erase from, or write to the second row of memory cells.

4. The memory array of claim 2, wherein the first row of memory cells and the second row of memory cells are substantially parallel to each other and to the first word-line.

5. The memory array of claim 1, further comprising:
   a first bit-line electrically coupled with the drains of the first and second transistors of the first memory cell and the drains of the first and second transistors of the third memory cell;
   a second bit-line electrically coupled with the drains of the first and second transistors of the second memory cell and the drains of the first and second transistors of the fourth memory cell;
   a first source-line electrically coupled with the sources of the first and second transistors of the first memory cell;
   a second source-line electrically coupled with the sources of the first and second transistors of the second memory cell;
   a third source-line electrically coupled with the sources of the first and second transistors of the third memory cell; and
   a fourth source-line electrically coupled with the sources of the first and second transistors of the fourth memory cell.

6. The memory array of claim 5, wherein the first bit-line is perpendicular to the first word-line and is disposed on a plane that passes between the first memory cell and the third memory cell.

7. The memory array of claim 5, further comprising a first non-volatile storage element coupled between the first bit-line and the drains of the first and second transistors of the first memory cell, a second non-volatile storage element coupled between the second bit-line and the drains of the first and second transistors of the second memory cell, a third non-volatile storage element coupled between the first bit-line and the drains of the first and second transistors of the third memory cell, and a fourth non-volatile storage element coupled between the second bit-line and the drains of the first and second transistors of the fourth memory cell.

8. The memory array of claim 7, wherein the first, second, third, and fourth non-volatile storage elements are disposed in a portion of the memory cell array that is capable of formation by a back end-of-line semiconductor fabrication process.

9. A semiconductor device comprising:
   first, second, third, and fourth memory cells each having a first transistor and a second transistor, each of the first transistors and second transistors having a source, a drain, and a gate;
   a first word-line electrically coupled with the gate of the first transistor of the first memory cell and the gate of the first transistor of the second memory cell;
   a second word-line electrically coupled with the gate of the second transistor of the first memory cell, the gate of the second transistor of the second memory cell, the gate of the first transistor of the third memory cell, and the gate of the first transistor of the fourth memory cell; and
   a third word-line electrically coupled with the gate of the second transistor of the third memory cell and the gate of the second transistor of the fourth memory cell, and
   wherein the first memory cell and the third memory cell are aligned to form a first row of memory cells and the second memory cell and the fourth memory cells are aligned to form a second row of memory cells, wherein the first row of memory cells is offset from the second row of memory cells along a longitudinal direction of the first row of memory cells.

10. The semiconductor device of claim 9, further comprising:
    a first bit-line electrically coupled with the drains of the first and second transistors of the first memory cell and the drains of the first and second transistors of the third memory cell;
    a second bit-line electrically coupled with the drains of the first and second transistors of the second memory cell and the drains of the first and second transistors of the fourth memory cell;
    a first source-line electrically coupled with the sources of the first and second transistors of the first memory cell;
    a second source-line electrically coupled with the sources of the first and second transistors of the second memory cell;
    a third source-line electrically coupled with the sources of the first and second transistors of the third memory cell; and
    a fourth source-line electrically coupled with the sources of the first and second transistors of the fourth memory cell.

11. The semiconductor device of claim 10, wherein the first row of memory cells and the second row of memory cells are substantially parallel to each other and to the first word-line.

12. The semiconductor device of claim 10, wherein the first bit-line is perpendicular to the first word-line and is disposed on a plane that passes between the first memory cell and the third memory cell.

13. The semiconductor device of claim 10, wherein the first word-line and the second word-line cooperate to read from, erase from, or write to the first row of memory cells, and the second word-line and the third word-line cooperate to read from, erase from, or write to the second row of memory cells.

14. The semiconductor device of claim 10, further comprising a first non-volatile storage element coupled between the first bit-line and the drains of the first and second transistors of the first memory cell, a second non-volatile storage element coupled between the second bit-line and the drains of the first and second transistors of the second memory cell, a third non-volatile storage element coupled between the first bit-line and the drains of the first and second transistors of the third memory cell, and a fourth non-volatile storage element coupled between the second bit-line and the drains of the first and second transistors of the fourth memory cell.

15. The semiconductor device of claim 14, wherein the first, second, third, and fourth non-volatile storage elements are disposed in a portion of the memory cell array that is capable of formation by a back end-of-line semiconductor fabrication process.

16. A method of fabricating a semiconductor device, the method comprising:
    providing a semiconductor substrate;
    doping source and drain regions of first and second transistors for each of a first memory cell, a second memory cell, a third memory cell, and a fourth memory cell;
    forming gates for each of the first and second transistors of each of the first, second, third, and fourth memory cells;
    coupling a first word-line to the gates of the first transistors of the first and second memory cells;
    coupling a second word-line to the gate of the second transistor of the first memory cell, the gate of the second transistor of the second memory cell, the gate of the first transistor of the third memory cell, and the gate of the first transistor of the fourth memory cell;
    coupling a third word-line to the gate of the second transistor of the third memory cell and the gate of the second transistor of the fourth memory cell;

coupling a first bit-line to the drains of the first and second transistors of the first memory cell and the drains of the first and second transistors of the third memory cell;

coupling a second bit-line to the drains of the first and second transistors of the second memory cell and the drains of the first and second transistors of the fourth memory cell;

coupling a first source-line to the sources of the first and second transistors of the first memory cell;

coupling a second source-line to the sources of the first and second transistors of the second memory cell;

coupling a third source-line to the sources of the first and second transistors of the third memory cell; and coupling a fourth source-line to the sources of the first and second transistors of the fourth memory cell.

17. The method of claim 16, further comprising aligning the first memory cell and the third memory cell in a first row of memory cells and the second memory cell and the fourth memory cells in a second row of memory cells, and further comprising offsetting the first row of memory cells from the second row of memory cells along a longitudinal direction of the first row of memory cells.

18. The method of claim 17, further comprising arranging the first row of memory cells and the second row of memory cells to be substantially parallel to each other and to the first word-line.

19. The method of claim 16, further comprising depositing the first bit-line perpendicular to the first word-line to be disposed on a plane that passes between the first memory cell and the third memory cell.

20. The method of claim 16, further comprising forming non-volatile storage elements in a back end-of-line semiconductor fabrication process for each of the first, second, third, and fourth memory cells.

* * * * *